United States Patent [19]

Kooi

[11] Patent Number: 4,903,109
[45] Date of Patent: Feb. 20, 1990

[54] SEMICONDUCTOR DEVICES HAVING LOCAL OXIDE ISOLATION

[75] Inventor: Else Kooi, Eindhoven, Netherlands

[73] Assignee: U.S. Philips Corp., New York, N.Y.

[21] Appl. No.: 21,563

[22] Filed: Mar. 2, 1987

Related U.S. Application Data

[63] Continuation of Ser. No. 160,650, Jul. 8, 1971, abandoned.

[30] Foreign Application Priority Data

Jul. 10, 1970 [NL] Netherlands ............... 7010204

[51] Int. Cl.⁴ .................................... H01L 27/04
[52] U.S. Cl. ........................................ 357/50; 357/48
[58] Field of Search ................................ 357/48, 50

[56] References Cited

U.S. PATENT DOCUMENTS

| | | | |
|---|---|---|---|
| 3,386,865 | 6/1968 | Doo | 317/235 |
| 3,534,234 | 10/1970 | Clevenger | 317/235 |
| 3,615,929 | 10/1971 | Portnoy et al. | 317/235 X |
| 3,648,125 | 3/1972 | Peltzer | 317/235 |
| 3,653,988 | 4/1972 | Glinski et al. | 317/235 |

FOREIGN PATENT DOCUMENTS 1077851 8/1967 United Kingdom ............... 317/235

OTHER PUBLICATIONS

*Electronic Design*, "Will Systems Houses Take over IC Design?" Dec. 26, 1968, pp. 64–65.

*IEEE Jornal of Solid State Circuits*, "Simplified Bipolar Technology and its Application to Systems" by Murphy et al., Feb. 1970, pp. 7–14.

*Philips Res. Repts*, "Local Oxidation of Silicon ... " by Appels et al, Apr. 1970, pp. 118–132.

Primary Examiner—William D. Larkins
Attorney, Agent, or Firm—Steven R. Biren

[57] ABSTRACT

A semiconductor monolithic integrated circuit comprising circuit elements built into isolated epitaxial layer islands is described. The isolation is accomplished by part by a p-n junction between the epitaxial layer and its substrate, in part by an insulated zone of converted epitaxial material sunken only part way through the layer, and in part by a depletion layer or buried zone of the substrate conductivity type.

2 Claims, 3 Drawing Sheets

SEMICONDUCTOR DEVICES HAVING LOCAL OXIDE ISOLATION

This is a continuation of application Ser. No. 160,650, filed Jul. 8, 1971, now abandoned.

BACKGROUND OF THE INVENTION

The invention relates to a semiconductor device, in particular a monolithic integrated circuit, having a monocrystalline semiconductor substrate body and an epitaxial layer which is provided thereon on one side and is divided into islands in which at least one circuit element is present, said islands being isolated from the substrate by at least one p-n junction and being separated from one another by an isolation zone which adjoins the isolation on the substrate side.

According to a known construction the epitaxial layer is provided on a substrate body of the opposite conductivity type. The epitaxial layer is divided into islands which are isolated from each other by means of isolation zones of the opposite conductivity type by locally diffusing a suitable impurity from the surface of the epitaxial layer. At the same time, an impurity of the same type which was previously diffused locally in the substrate surface, may diffuse in the epitaxial layer from the substrate. One or more zones may be provided in the island, for example, by diffusion, to form a semiconductor circuit element, for example, a transistor, a diode, a resistor or capacitor. The material of the epitaxial layer remaining after said formation may itself form a component of the circuit element, but in principle it may also serve as an isolation of a circuit element formed in the island. The advantage that such isolation zones can be formed by means of conventional planar techniques and that they can be covered with an oxide layer in normal manner across which layer metal conductors can be conducted, for example, for interconnections of circuit elements in different islands, is offset by the drawback that such an isolation zone has a high doping concentration, particularly at the surface, so that the p-n junction with a juxtaposed island zone has a comparatively low breakdown voltage and high capacity. Moreover, zones of a conductivity type opposite to that of the epitaxially provided material and provided in the island should be separated from the isolation zone by an intermediate zone of the type of the epitaxially provided material, for example, consisting of the epitaxial material itself. Such a separation requires additional space at the surface. When said intermediate zone has a low doping concentration, as will usually be the case, for example, when using the doping in the original epitaxially provided material, there is a possibility that inversion channels are formed at the surface which produce a short-circuiting connection between the isolation zone and a zone present in the island. In order to inhibit such an inversion it is possible to increase the surface concentration of the doping by diffusion but in this case either sharper p-n junctions are formed with proportionally lower breakdown voltage and higher capacity, or more space is required to obtain some distance between said highly doped region and the isolation zone.

SUMMARY OF THE INVENTION

One of the objects of the present invention is to provide a semiconductor device of the type mentioned above, in particular a monolithic integrated circuit, having improved island isolation.

According to the invention a semiconductor device, in particular a monolithic integrated circuit, having a monocrystalline semiconductor substrate body and an epitaxial layer which is provided thereon on one side of it and is divided into islands in which at least one circuit element is provided, which islands are isolated from the substrate by at least one pn junction while they are separated from each other by an isolation zone which adjoins the isolation on the substrate side, is characterized in that the part of the isolation zone adjoining the surface of the epitaxial layer is formed by a sunken insulation layer sunk inthe epitaxial layer and consisting of an insulating material formed by conversion of the semiconductor material, said insulation layer extending only over part of the thickness of the epitaxial layer. A "sunken insulation layer" is to be understood to mean herein an insulation layer which, as regards its depth in the epitaxial layer, is clearly distinguished from differences in height at the semiconductor surface, as a result of conventional planar methods, with diffusions and oxide maskings, in which differences in height of only a few tenths of a micron can occur at the semiconductor surface.

By applying the sunken insulation layer just in that part of the isolation zone which separates juxtaposed islands in the epitaxial layer from one another, in which the isolating properties would be poorer when known isolation zones formed only by diffusion would have been used, most profitable use is made of said insulation layer. It is to be noted that it is known per se to provide grooves for the formation of isolation zones by local material-removing treatments. It is known to leave said grooves unfilled with the exception of a possible oxide film on the wals of the grooves. In this case it is difficult, however, to provide conductive interconnections between the formed islands. It is also possible to fill the said grooves by depositing suitable materials in them, as described in U.S. Pat. No. 3,500,139.

In this case, however, material is also deposited on the higher adjacent parts so that a surface is obtained which is less suitable for application of normal photographic methods and which is difficult to make flat and then only by using considerable thicknesses of the deposit. When forming a sunken insulation layer consisting of genetic insulation material formed by conversion of the semiconductor material, surface parts of the semiconductor can be screened locally by application of a suitable masking. The thickness of the insulation layer is correlated with the thickness of the semiconductor material which has been converted. The ratio between said thickness is determined by the volume occupied by the reaction product relative to the volume of the converted semiconductor. In the case of conversion of silicon into silicon dioxide, said ratio is approximately 2:1, since the oxidation of silicon is associated with approximately a doubling in volume. It is furthermore to be noted that in the lastmentioned case, in which the epitaxial layer consists of silicon, an oxidation process may be used which fits within the frame work of conventional planar methods used thus far in the manufacture of integrated circuits.

The thickness of the insulation layer consisting of insulation material obtained by conversion of the semiconductor material can be adjusted rather accurately, since the rate at which the thickness increases becomes smaller as the thickness already obtained becomes larger. On the other hand, the last-mentioned phenomenon has the drawback that in order to obtain large thicknesses, such long reaction times are necessary that the process becomes less attractive. An advantage of the semiconductor device proposed by the present invention over that disclosed in may prior copending application, Ser. No. 32,579, filed Apr. 28, 1970, is that it is not necessary to restrict the use of said sunken insulation layers, consisting of insulation material obtained by conversion of semiconductor material, to epitaxial layers of thicknesses which may at most be equal to the depth of the sunken insulation layer. Deeper in the epitaxial layer, the remaining part of the isolation zone may be formed in the semiconductor material itself without important objections.

In the case in which the substrate body consists of a semiconductor material of a conductivity type opposite to that of the epitaxial material provided thereon, it is possible to effect a mutual island isolation in that the sunken insulation layer reaches down to the depletion layer of the p-n junction between the substrate and the epitaxial layer. According to a further embodiment, the isolation zone comprises a buried layer which is present below the sunken insulation layer and is of a conductivity type opposite to that of the epitaxially provided material of the epitaxial layer, said buried layer extending from the substrate in the epitaxial layer. In this case the insulation layer may extend at least down to the depletion layer of the p-n junction between the buried layer and the material of the epitaxial layer present above it. However, the buried layer may also extend up to the sunken insulation layer. When using such a buried layer one has to do with comparatively high doping concentrations. In connection with the danger of short-circuits between doped zones possible present in the islands and said buried layer, a sufficient distance should be preserved between such a doped zone and said layer. Such a consideration does not apply to the insulation layer. Taking the above into account, in particular with a view to space saving, the buried layer is preferably given such a small diameter that, in a direction transverse to the surface of the sunken insulation layer, the sunken insulation layer overlaps the buried layer on all sides. In connection with its function, the insulation layer should preferably be given a reasonable inset depth in the epitaxial layer. Not only is this desirable to obtain improved isolation zones between the islands when using suitable thicknesses of the epitaxial layer, but also should the insulation layer create a sufficient distance between the underlying semiconductor material and conductive connections possibly led over the insulation layer in order that the capacitive coupling between them be small. For the above reasons, the insulation layer preferably extends in the epitaxial layer at least over a depth of $0.5/\mu$.

According to a preferred embodiment a further space saving can be obtained in the case in which at least one of the circuit elements in an island comprises a zone which is provided in the epitaxial layer and adjoins the surface of th eepitaxial layer. Actually it is possible in that case that such a zone adjoins the insulation layer at least along a part of its circumference. The depth of the sunken insulation layer generally is larger than the depth of the relative zone. An additional advantage is that the area of the p-n junction with the adjacent material of opposite conductivity type, and hence the capacity of said junction, is reduced, while in this case such a zone does not along its whole circumference, and when bounded by the sunken insulation layer along its whole circumference does nowhere, form a strongly curved boundary with the semiconductor material of the opposite conductivity type. As a result of this, such a zone is particularly suitable for use as the base zone of a transistor. In such a case, the part of the epitaxial layer adjoining the base zone preferably forms the collector of the transistor and in the collector zone adjacent to the base zone, a collector contact zone adjoining the surface of the epitaxial layer is present said contact zone having the same conductivity type as but a higher doping than the collector zone, said contact zone also adjoining the sunken insulation layer at least along part of its circumference. In this manner a further space saving of a transistor present in an island is obtained. A gradual decrease of the surface concentration towards th eisolation zone is superfluous, since the isolation zone at that area consists of an insulating material. In that case the depth of the highly doped zone should preferably not exceed the depth of the sunken insulation layer.

According to a further preferred embodiment the semiconductor device comprises on the side of the epitaxial layer a substantially flat surface. A substantially flat surface is to be understood to mean herein a flatness which is of the same order as is obtained with conventional planar technics. In conventional planar technics, oxide layers of at most $0.5/\mu$ are used. If, while using conventional planar technics, thick non-sunken oxide films should be used of, for example, $2/\mu$ to reduce the wiring capacity due to the capacitive coupling between conductive strips on the oxide and the underlying semiconductor material, and if windows should be etched in such a thick oxide, for example, for providing contacts, such a thick oxide has the drawback that the etching of said windows is associated with considerable underetching, while with the conductive connection between a contact in the window and a supply conductor on the oxide, a difference in height of $2/\mu$ should be bridged.

By using sunken insulation, for example, sunken silicon oxide, obtained by local oxidation of silicon with the sue of a masking on adjacent semiconductor regions, for exmaple, by means of silicon nitride, substantially flat junctions can be obtained while nevertheless very thick insulation material favorable for a low wiring capacity is used. The original thickness of the converted semiconductor material actually determines, as already stated above, the thickness of the resulting insulation layer. Taking into account the ultimate height of the insulation on the semiconductor adjacent to the sunken insulation layer, the semiconductor surface may previously be given such a profile that after the formation of the sunken insulation layer the surface of said layer becomes located approximately level with the semiconductor surface beside the sunken insulation layer. In the theoretical case in which the formation of the sunken insulation layer would give rise to a reduction in volume by reaction with the semiconductor, some semiconductor material adjacent to the sunken insulation layer to be formed can be remvoed previously be etching with the use of a masking. In such cases, as in the formation of a sunken insulation layer by oxidation of epitaxial silicon using a mask, however, a considerable increase in volume takes place due to the conversion. In that case, semiconductor material may be etched away at the area of the sunken insulation layer to be provided, preferably by using the masking which is also used during the conversion for the formation of the sunken insulation layer, so that at the area where the sunken insulation layer is to be formed, the semiconductor surface becomes located lower than the adjacent semiconductor surface, namely to a depth such that after the formation of the sunken insulation layer the surface of the sunken insulation layer, due to the increase in volume, becomes located approximately level with the adjacent semiconductor surface or the insulation ultimately used thereon. At most, small unevennesses at the junction between the layers can be formed which, however, are not of such a nature as to be annoying for providing metal conductors across the insulation zone.

BRIEF DESCRIPTION OF THE DRAWING

The invention will now be described in greater detail with reference to the accompanying drawing, which is drawings which are meant to illustrate several possibilities which can be achieved by using isolation zones according to the invention. Those skilled in the art may use them to obtain any special integrated circuit within the scope of the present invention.

DESCRIPTION OF THE PREFERRED EMBODIMENTS

Figure 1:
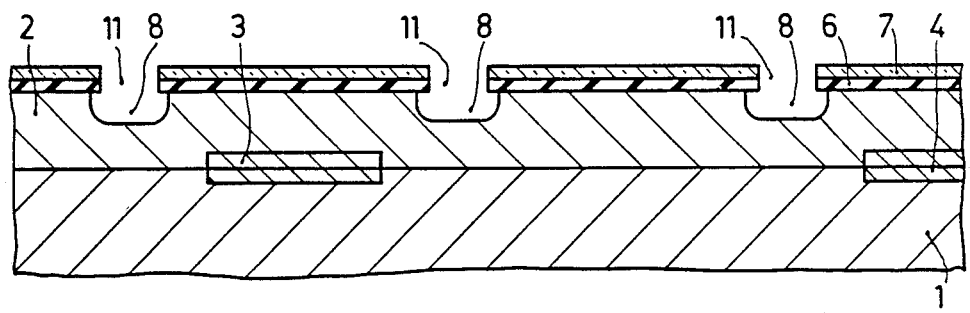
FIGS. 1 to 3 are diagrammatic cross-sectional views of portions of successive stages in the manufacture of an embodiment of a semiconductor device according to the invention having a number of semiconductor circuit elements present in islands.

A monocrystalline semiconductor body 1 consisting of p-type silicon having a resistivity of 1 ohm.cm, and having, for example, a thickness of 100 to $150/\mu$ and a diameter between 2 and 4 cm, which, if desirable, may be severed afterwards to obtain a number of individual semiconductor devices, is provided on one side with an epitaxial layer 2 (see FIG. 1). Arsenic-doped n+ zones are locally provided previously on that side by planar methods known per se to form buried n+ layers 3 and 4. The epitaxially deposited material consists of n-type silicon having a resistivity of 1 ohm.cm. The material for the formation of the epitaxial layer 2 can be deposited in known manner by decomposition of silane or a reaction of halogen silane with hydrogen. The thickness of the epitaxial layer in this case is $2.5/\mu$. Due to diffusion of the arsenic, the arsenic-doped n+ zone provided in the substrate may possibly expand slightly in the epitaxial layer 2. A layer 6 of silicon nitride is deposited in known manner. this silicon nitride layer 6 may be provided, for example, by heating the body 1 with the epitaxial layer 2 at a temperature of approximately 1000° C. in a gas mixture of $SiH_4$ and $NH_3$. The thickness of the silicon nitride layer is approximately $0.15/\mu$. Below the nitride a very thin silicon oxide layer (not show) may be used, for example, of approximately 500Å. A silicon oxide layer 7 having a thickness of $0.2/\mu$ is deposited on the silicon nitride layer 6, for example, from a gas mixture consisting of a carrier gas, for example, argon, with $SiH_4$ and oxygen. In particular the silicon nitride layer 6 serves to mask the underlying silicon against oxidation in a subsequent step of locally forming the sunken insulationlayer of silicon oxide.

At the area of the sunken insulation layer to be formed, apertures 11 are made in the nitride-oxide layers 6,7. For that purpose, local apertures are first provided in the oxide layer 7 in normal manner by using photoresist and a hydrofluoric acid etchant, after which the remaining parts of said oxide layer are used as a masking for the local etching away of the nitride layer 6 with orthophosphoric acid.

The resulting local masking is first used to etch grooves 8 in the epitaxial layer 2 by means of a known slow etchant for silicon. In the present case, for example, grooves are etched having a depth of well over $1/\mu$. The stage shown in FIG. 1 is now obtained.

Figure 2:
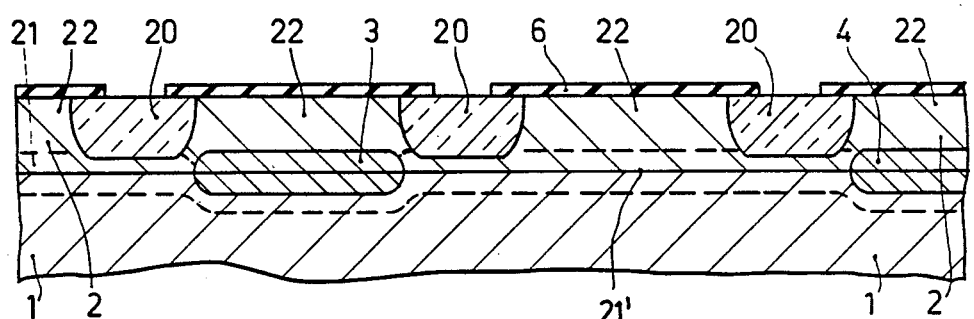

The oxide layer 7 is now etched away with hydrofluoric acid. The semiconductor body is then subjected to an oxidizing treatment in steam at a pressure of approximately 1 atmosphere and at a temperature of approximately 1000° C. The nitride 6 protects the underlying surface of the silicon from the action of the oxidizing atmosphere. In the grooves 8, however, the steam can act on the silicon, forming silicon oxide. Since the formed silicon oxide occupies well over double the volume of the original silicon which has been converted, the oxide forming at the walls of the grooves is expanding both in the epitaxial layer 2 and in the groove itself. After a treatment time of approximately 16 hours, a sunken oxide layer 20 is formed in the grooves to a depth of $2/\mu$, the oxide filling the original grooves 8 substantially entirely. The buried layers 3 and 4 may meanwhile have expanded slightly in the epitaxial layer 2 by further arsenic diffusion. The resulting stage is shown in FIG. 2. Further details on this and other methods for sinking an oxide into a semiconductor may be found in my Canadian Pat. No. 826,343, U.S. Pat. No. 3,544,858, and Phillips Research Reports, 25, 118–132, Apr. 1970.

The upper side of the sunken insulation layer 20 is now substantially at the same level as the upper side of the epitaxial layer 2. The lower side of the sunken insulation layer 20 is present at a distace of approximately $\frac{1}{2}/\mu$ from the p-n junction 21' between the p-type substrate material 1 and the N-type material of the epitaxial layer 2. On either side of the p-n junction between the substrate 1 and the epitaxial layer 2, a depletion layer 21 will be formed by the diffusion of charge carriers and the resulting contact potential when no external voltage is applied across said junction 21'. The thickness of the epitaxial layer and the depth of the sunken insulation layer 20 may be chosen to be so that, without applyig an external voltage, said depletion layer adjoins the lower side of the sunken insulation layer. Preferably, however, it will be ensured in the semiconductor device manufactured that when sufficiently high voltage is set up in the reverse direction across the said p-n junction during normal operation of the device the formed depletion layer 21, the boundary of which is shown in broken lines in FIG. 2, reaches sufficiently far in the epitaxial layer to form an isolation zone which consists partly of the sunken insulation layer 20 and partly of the underlying part of the depletion layer 21. In this manner the epitaxial layer is divided into islands 22 which are laterally separated from each other by the isolation zone, partly formed by the sunken insulation layer 20 and, at least during operation of the semiconductor device, partly by the underlying part of the depletion layer 21.

In known manner circuit elements may be formed in the resulting islands by meas of conventional diffusion methods in which, if desirable, the masking with the nitride layer 6 already present may be used, but which nitride layer may also be remvoed entirely and be replaced by a fresh oxide layer, while also combinations of parts consisting of the old masking layer with nitride and a new masking layer of oxide may simultaneously be used. If desirable, the nitride layer in the ultimate semiconductor device may also locally serve as an insulating surface coating.

Figure 3:
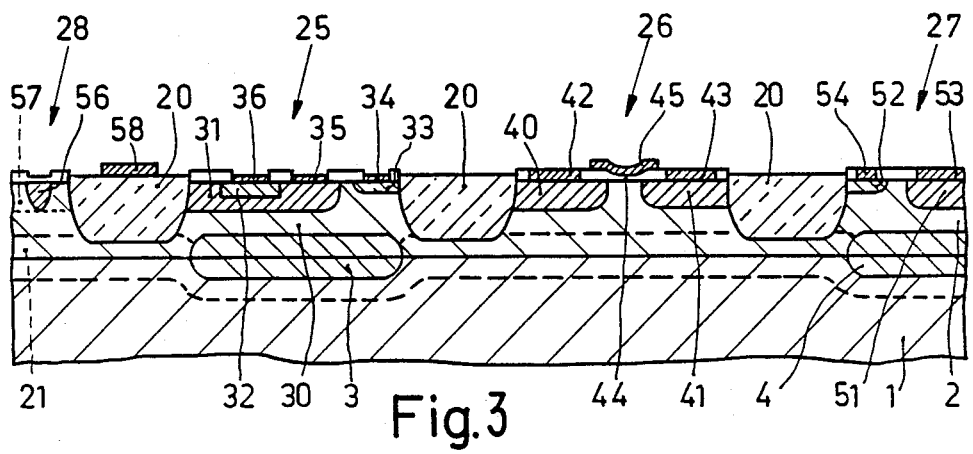

FIG. 3 shows semiconductor circuit elements provided in the islands of the epitaxial layer, namely in a first island an n-p-n transistor 25, in a second island a MIS transistor 26, in a third island a diode 27 and in a fourth island a resistace element 28.

The transistor 25 is obtained by locally diffusing into the said first island below which the buried layer 3 is provided an acceptor, for example boron, to form the base 31, and locally diffusing a donor, for example, phosphorous, to form the emitter 32 by means of known planar technics. The collector is constituted by the remaining n-type material 30 of the epitaxial layer, the buried layer 3 serving to reduce the collector series resistannce, and a highly doped surface contact zone 33 formed simultaneously with the emitter diffusion. The depth of the base diffusion zone 31 is, for example, $1/\mu$. It adjoins over part of its circumference the sunken insulation layer 20, while the collector contactzone 33 which has a thickness of approximately $0.5/\mu$, is present at some distance from the base zone 31, but also adjoins along part of its circumference the sunken insulation layer 20. Since both the base zone and the collector contacting zone immediately adjoin the isolation zone and no intermediate space is required between the isolation zone and the two first-mentioned zones, space is saved in that the device occupies less space than the prior art versions. Smaller devices means higher packing densities and higher yields. In the present construction the size of the base-collector junction and hence th eocllector-base capacity is reduced. It is even possible, for example, when using a rectangular base zone to cause three sides to adjoin the sunken insulation layer 20. It is to be noted that the buried layer 3 as well as the buried layer 4 may adjoin the sunken insulation layer 20 without important objection if it is ensured that a sufficiently wide zone of the depletion layer adjoining the insulation layer 20 remains in order to form an effective isolation zone. The transistor 25 is provided at the surface in known manner with a thin insulation layer, for example, of silicon oxide, in which windows are provided for the collector contact 34 on the collector contacting zone, a base contact 35 and an emitter contact 36. On said thin insulation layer, connections in the form of metal strips to the contacts 34, 35 and 36 may be provided in known manner.

The MIS transistor 26 is provided in known manner with source and drain 40 and 41, respectively, formed during th ebase diffusion of the transistor 25. The material of the intermediate gate region consists of n-type silicon having substantially the original composition of the epitaxial layer 2. The insulation provided on said intermediate gate region may consist of a thin layer of silicon oxide which has been provided but it may also consist of the nitride layer or oxide - nitride layer as was used originally for masking during the formation of the sunken insulation layer. The gate electrode 45 consisting of vapor-deposited metal is present on the insulation layer 44. The source and drain regions are provided with contacts 42 and 43, respectively. The source and drain regions adjoin the sunken insulation layer 20, thus saving space and reducing the capacity. The present construction makes it possible, inter alia, when using a number of MIS transistors preset in separate islands to obtain MIS transistors having differennt threshold voltages by applyinng separate voltages to the epitaxial material in the islands relative to the associated source regions.

The diode 27 comprises an n-type electrode formed by the epitaxially provided material, the buried layer 4 to reduce the series resistance of the diode, and a contacting zone 52 formed during the emitter diffusion, and a p-type electrode 51 formed during the base diffusion. In this case also space may be saved by causing zones 52 and 51 to adjoin the sunken insulation lauyer 20, while in connection with the capacity, similar advantages can be obtained as noted above for the base zone 31 of the transistor 25. The diode 27 furthermore comprises vapor-deposited ohmic contacts 53 and 54. It is also possible to form in an island a resistance element 28 by forming a narrow elongate resistance strip 56 of p-type silicon in the n-type epitaxial material in known manner during the base diffusion for the transistor 25 which strip is provided at its end with wide contat zones, also by means of the base diffusion. FIG. 3 shows such a contact strip 57 situated towards the rear side by means of broken lines which denote the lower limit of said zone with the original epitaxially provided n-type material. The contact zones may laterally adjoin the sunken insulation layer 20 as a result of which space may be saved. The resistance strip 56 may extend according to a straight line. It is also possible to construct such a resistance strip in the form of a meander. Since the possibility of breakdown with isolation zones need not be taken into account in the present case, the distance of the meander-shaped resistance strip up to the sunken insulation layer may be kept small which also means a space saving as compared with isolationzones obtained entirely by diffusion.

The sunken insulation layer 20 may furthermore serve as a carrier for metal connection strips and supply conductors, for example, 58. Since the surface of said sunken insulation layer is approximately level with the surfaces of the adjacent much thinner insulation layers on the islands, the diffuculty of obtaining connections across surfaces having very strongly different levels, as would be present in case of non-sunken thick masking layers and windows provided therein, when passing such connections two surfaces on thin insulation layers or surfaces of the semiconductor in the contact windows, is obviated. Nevertheless the advantage is obtained that the capacitive couplinng between the conductor 58 and the underlying semiconductor material is only small.

As already noted above, a contact potential may be formed across a p-n junction without an externally applied voltage by diffusionof charge carriers as a result of the concentration differences between said charge carriers on either side of the p-n junction. The resulting voltage across the p-n junction causes a depletion layer. It is possible that said depletion layer across the p-n junction between the substrate and the epitaxial layer in the device shown in FIG. 3 will already reach up to the sunken insulation layer 20. Generally, however, it is recommendable to apply a sufficiently high voltage in the reverse direction between the p-type substrate 1 and the adjoining island parts of n-type material of the epitaxial layer 2 so as to ensure that the said depletion layer is sufficiently wide in order that sufficiently effective isolation zones are formed with the sunken insulation layers 20. It is to be noted that it is conventional in integrated circuits having semiconductor circuit elemets which are separated from each other laterally by isolation zones built up in the epitaxial layer of one conductivity type, which epitaxial layer is provided on a substrate of the opposite conductivity type, to set up a voltage at said substrate in the reverse direction equal to the highest voltage, viewed in the reverse direction, which is used in the integrated circuit itself. In the case shown in FIG. 3, for example, the same bias voltage can be applied to the p-type substrate 1 as to the base 31 of the transistor 25.

It is furthermoire to be noted that the possibility exists that the depletion layer 21 and the associated space charge region has expanded so far in the epitaxial layer that the danger of side effects in the islands, by interaction with diffused zones, arises for example, transistor action or punch-through effect. By using highly-doped buried layers below the islands of the same type as the epitaxial layer 2, such as zones 3 and 4 in FIG. 3, such an excessive expansion of the depletion layers in the islands can be obviated.

In the embodiment shownin FIG. 3, the isolation zones between the islands in the epitaxial layer 2 are formed by the buried insulation layer 20, and the adjoining parts of the depletion layer 21 below said layer, which layer interrupts an ohmic connection between adjacent islands via the epitaxial material present below the sunken insulation layer. However, it is alternatively possible to use below the sunken insulation layer a buried layer of a conductivity type opposite to that of the epitacial layer, which buried layer has expanded from the substrae in the epitaxial layer. Such a case will now be described with reference to FIGS. 4 to 7.

Figure 4:
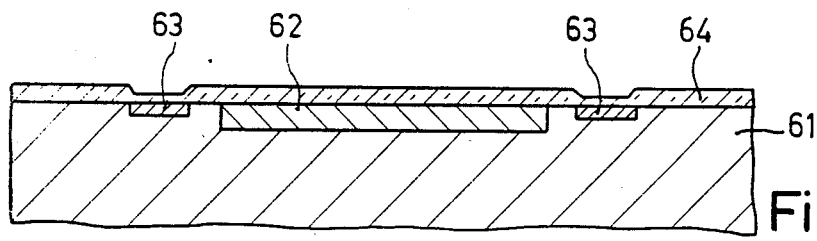
FIGS. 4 to 7 are diagrammatic cross-sectional views of portions of successive stages in the manufacture of another embodiment of a semiconductor device according to the invention.

The starting material is a monocrystalline semiconductor body 61 of p-type silicon, in which by means of conventional planar methods arsenic-doped low-ohmic n-type zones 62 and a boron-doped low-ohmic p-type zone 63 are formed. The zone 63 has the form of a network, and may enclose the zones 62 laterally. The parts of said zone 63 may have a width of $3/\mu$. The resulting stage is shown in FIG. 4. As is usual in planar diffusion methods, an oxide layer 64 is present on the surface of the semiconductor body 61. This oxide layer is now removed in normal manner by means of hydrofluoric acid.

A high-ohmic n-type epitaxial layer 68, for example $4/\mu$ thick, is then deposited on the silicon body 61. During this depositionthe zones 62 and 63, which become buried layers, can expand in the epitaxial layer 68 by diffusion. Particularly the buried layer 63 can expand more rapidly than the buried layer 62, since boron diffuses more rapidly than arsenic.

Figure 5:
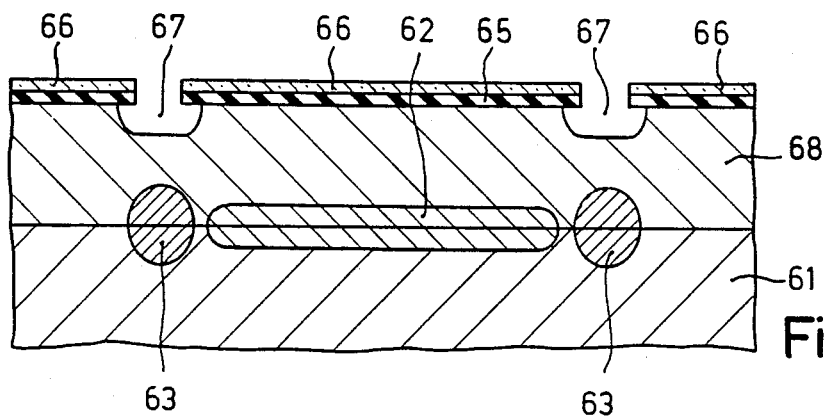

In a corresponding manner as described above, the surface of the epitaxial layer 68 is covered with a thin silicon nitride layer 65 and then with a silicon oxide layer 66. In these layers apertures are provided above the p-type buried zone 63 likewise in the form of a network. The width of said apertures is at least $5/\mu$. while using the nitride oxide masking 65, 66, grooves 67 are etched in the silicon with a depth of well over $1/\mu$. The resulting stage is shown in FIG. 5.

Figure 6:
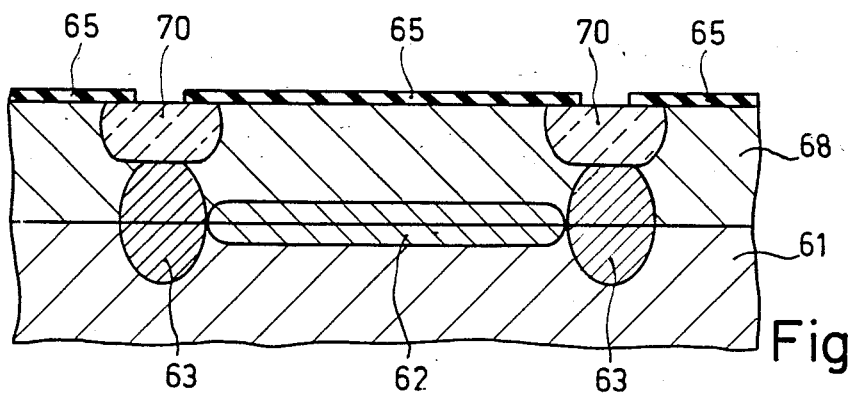

The oxide layer 66 is then removed by means of a conventional hydrofluoric acid etchant and the assembly is then subjected to an oxidizing treatment as described above to form a sunken insulation layer 70 consisting of silicon oxide, the silicon nitride masking 65 protecting the underlying silicon outside the grooves 67. The oxidation treatment is continued to a depth of approximately $2/\mu$, the formed oxide also filling entirely the original grooves 67. Meanwhile the boron-doped p-type buried layer 63 has further expanded in the epitaxial layer. In that stage, or after a subsequent heating treatment, it may adjoin the lower side of the formed sunken insulation layer. The resulting stage is shown in FIG. 6. The epitaxial layer 68 is now divided into islands which are separated from each other by means of isolation zones formed by the sunken insulation layer 70 and the buried p-type layer 63.

Figure 7:
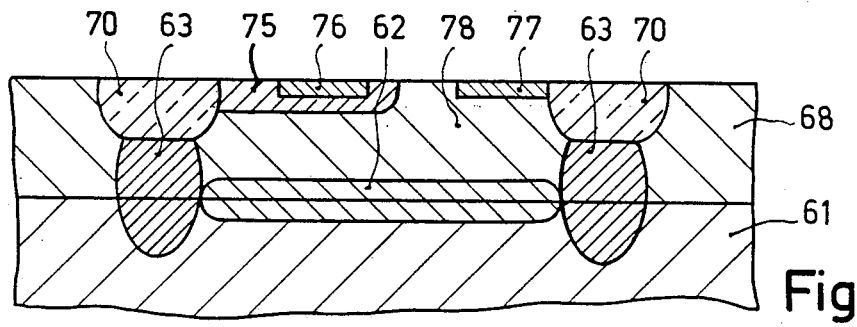

In known manner, for example, by means of planar diffusion methods, circuit elements can be formed in the islands as, for example, the n-p-n transistor shown in FIG. 7, substantially corresponding with the transistor 25 shown in FIG. 3. The collectro is formed by the epitaxial n-type material 78, the arsenic-doped buried layer 62, and the collector contacting zone 77 formed during the emitter diffusion, the base is formed by the p-type zone 75 formed by diffusion of boron and the emitter is formed by the n-type zone 76 formed by diffusion of phosphorus. The resulting stage is shown in FIG. 7.

Since it has been ensured during the manufacture that the sunken insulation layer became wider than the buried p-type layer 63, the distance between the buried layer 63 and the base zone 75 is kept large notwithstanding the fact that the base layer 75 adjoins the sunken insulation layer 70.

In a similar manner as described with reference to FIG. 3, the advantage in the case of the device shown diagrammatically in FIG. 7, is obtained that the upper side of the insulation layer 70 is at approximately the same level as the adjacent surface of the epitaxial layer. In this case also adjoining contacts in windows in thin insulation layers used on the island surface may be provided in known manner and supply conductors may be used which preferably extend as much as possible over the insulation layer 70. In the case described with reference to FIG. 7, a thick epitaxial layer is used, in which it is avoided, however, for the good formation of isolation zones, to use a proportionally thicker sunken insulation layer. If desirable, the thickness of the epitaxial layer 68 may also be chosen to be so large that the sunken insulation layer 70 does not reach down to the buried layer 63. Actually, if the distance between the sunken insulation layer and the buried layer 13 is not too large, and if a sufficiently high reverse voltage is set up between the substrate and the epitaxial layer, a depletion layer will be formed between the buried layer 63 and the sunken insulation layer 70 to obtain an isolation zone which divides the epitaxial layer 68 in islands which are isolated from each other. It is apparent that other circuit elements, for example, other transistors, may also be provided in the islands present beside the island in which the transistor shown in FIG. 7 is present. Reference is also made to a concurrently filed patent application, Ser. No. 160,652, for a description of another method of making the embodiment of FIG. 7 wherein the buried layer 63 is initially formed in the epitaxial layer and advanced into the substrate during sinking of the oxide 70.

Figure 8:
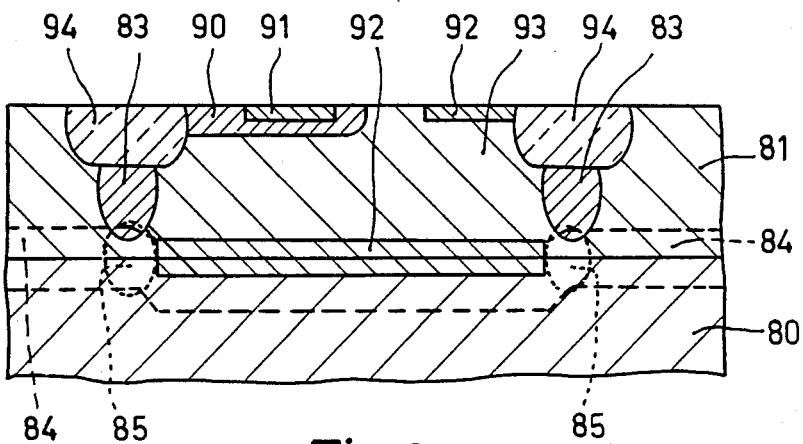
FIG. 8 diagrammatically shows in detail a vertical cross-sectional view of island isolations according to possible variations within the scope of the invention.

In the embodiment shown in FIG. 7, in which an n-type epitaxial layer on a p-type substrate and an insulation layer which is partly inset in said epitaxial layer are used, a highly doped buried layer of the p-type present in the substrate is used which layer has expanded by diffusion to the lower side of the insulation layer. Of course it is also possible, as shown in FIG. 8, for example, in the case of an epitaxial layer of the n-type on a substrate of the p-type and an insulation layer inset over part of the thickness of the epitaxial layer, to use a layer in the epitaxial layer of the conductivity type of the substrate present on the lower side of the insulation layer. This p-type layer 83 present below the sunken insulation layer 94 may have expanded, for example, by diffusion down to the p-n junction formed between the substrate 80 and the epitaxial layer 81. It is also possible that said p-type layer 83 adjoining the sunken insulation layer 94 has expanded down to the depletion layer 84 formed between the p-type substrate 80 and the epitaxial layer 81. In this manner, isolation zones formed partly by the sunken insulation layer and partly by isolation layers formed in the semiconductor material are preset said isolationzones, for example, isolating the n-p-n transistor shown in FIG. 8 and having the collector consisting of the part of the original epitaxial material 93 surrounded by isolation zones, the highly doped n-type buried layer 82 and the collector contacting zone 92, the base zone 90 of p-type material and the emitter zone 91 of n-type material, from the adjacent parts of the epitaxial layer 81. The layer 83 may be formed, for example by forming an epitaxial layer 81 in two steps and intermediately diffusing locally an acceptor, for example, boron. It is of course also possible to use below the layer 83 a boron-doped buried layer 85 provided by local diffusion in the substrate surface, preceding the provision of the epitaxial layer 81, which p-type buried layer has expanded in the epitaxial layer, for example, to such an extent that it is connected to the layer 83 to form a common p-type region connected to the substrate. The boundaries of such a buried layer 85 are denoted in FIG. 8 by broken lines. It is in addition possible that a depletion layer is used which adjoins the burried layer 85 and reaches up to the p-type layer 83.

The above examples described with reference to FIGS. 1 to 8 relate to a p-type substrate and an n-type epitaxial layer. In a corresponding manner, of course, an n-type substrate and a p-type epitacial layer may be used as the starting material in which in a coresponding manner the various zones and buried layers can also be chosen to be of a correspondingly other conductivity type. In that case, for example, phosphorus may be used as a doping for the buried layers 63 os FIG. 7 and 85 of FIG. 8, as well as for the layer 83 of FIG. 8, as an n-type doping material in silicon. Both boron and phosphorus have a very high solubility in silicon while the diffusion properties do not vary much.

Figure 9:
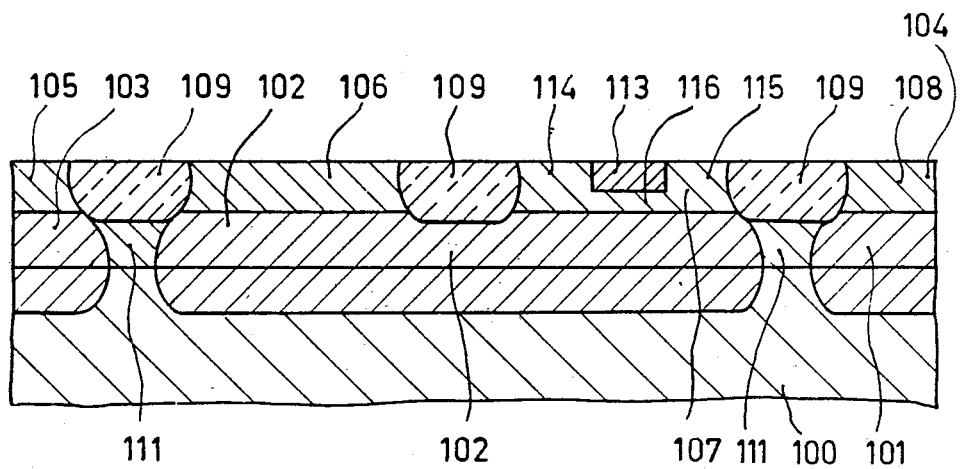
FIG. 9 is a portion of a vertical cross-sectional view of other possibilities of island isolations within the scope of the invention.

FIG. 9 shows possibilities of island isolation according to the invention in the case in which a monocrystalline substrate body is used having the same conductivity type as that of the epitaxial layer present thereon. The monocrystalline silicon substrate body 100 consists, for example, of n-type material having a resistivity of, for example, 1 ohm.cm. An epitaxial layer 104 provided thereon consists of silicon of the same conductivity type and approximately the same resistivity while at the boundary of the substrate body and the epitaxial layer a number of buried layers 101, 102 and 103 of p-type silicon are provided which are separated from each other by a network of narrow regions 111 of the high ohmic n-type material of the substrate and the epitaxial layer. The buried layers are doped, for example, with boron and have expanded from the boundary between the substrate and the epitaxial layer.

From the upper side of the epitaxial layer a sunken insulation layer is provided, as already described above, the upper surface of which is approximately level with the upper side of the adjacent parts of the epitaxial layer. The sunken insulation layer 109 inter alia overlaps the n-type regions 111 between the buried layers 101, 102 and 103. Furthermore, it may also be provided locally according to intermediate strips extending from the top to a, for example, more central part of the buried layer 102. In this manner the epitaxial layer 104 is divided into n-type islands 105, 106, 107 and 108 which are separated from the n-type substrate 100 by two p-n junctions and are separated from each other by isolation zones which partly consist of the sunken insulationlayer 109. For example, the islands 105 and 106 are separated from each other by the sunken insulation layer 109, the parts of the buried layers 102 and 103 facing each other, and the intermediately located high-ohmic n-type region 111, the islands 106 and 107 are separated from each other by the sunken insulation zone 109 and the buried layer 102 and the islands 107 and 108 are separated from each other by the sunken insulation zone 109, the end parts of the buried layers 101 and 102 facing each other and the intermediately located high-ohmic n-type region 111. Semiconductor circuit elemets may be formed in known manner in the islands which are separated from each other. It is possible that such an underlying buried layer serves for double isolation but is is also possible that such a buried layer which actually is separated from the substrate body by a p-n junction of the n-type material, forms a functional part of a circuit element to be provided, for example, the collector of a p-n-p transistor. When it is provided below more than one island it may also serve as a connection, for example, as a common, possibly floating, electrode of two circuit elements provided in the islands 106 and 107. Alternatively such a buried layer may form a functional part of a circuit element and an insulation for another circuit element. Furthermore, in order to obtain islands of larger depths, it is possible, to use layers, the upper side of which is situated deeper than the lower side of the sunken insulation layer, using narrow intermediately located zones of the conductivity type of the buried layers producing a connection between the sunken insulation layer and the buried layers in such manner that islands isolated from each other are formed which, however, may each have locally a larger depth than the sunken insulation layer 109.

An island structure corresponding to FIG. 9 can also be obtained by using a p-type substrate 100 on which p-type epitaxial material 104 is provided and in which n-type buried layers 101, 102 and 103 are used.

It is to be noted that the figures are meant to indicate that within the scope of the present invention a variety of embodiments are possible. Furthermore types of circuit elements shown are not limitative. Semiconductor circuit elements having contacts of the Schottky type may also be used while also field effect transistors having a connection between source and drain which can be closed by variation of the depletion layer of a p-n junction, can be realized in known manner, in particular in the device shown in FIG. 9. For example, a p-type zone 113 may be diffused in the island 107, together with the buried layer 102 forming a gate for the current path from source 114 to drain 115 via the narrow gate zone 116 which can be closed by providing a sufficient reverse voltage at the gate electrode 113. It is also possible to use the narrowed part 116 of high-ohmic n-type material as a resistor.

Instead of using a diffused resistor laterally bounded by a p-n junction, for example, in the resistance element 28 of FIG. 3, it is also possible to provide a resistor by diffusion in a narrow strip between two parallel parts of the sunken insulation layer. The capacitive coupling across th ep-n junction between such a resistance element and the adjoining semiconductor material, is restricted to the lower side of such a resistance strip, while the capacitive copupling of the resistance strip 56 in the resistance element 28 with the material of the epitaxial layer 2, surrounding the strip also laterally, is much larger due to the larger area of the p-n junction.

Many variations are possible without departing from the scope of the present invention. In FIG. 6, for example, two islands can be connected electrically, if desirable, below the sunken insulationlayer 70 via the epitaxial material 68 or via a local extension of the buried n-type layer 62 with a local interruption of the p-type buried layer 63. If desirable, a lcoal interruption of the sunken insulation layer 70 can also be used, while, if desirable, the sunken insulation layer may comprise extensions present in the islands, for example, as a carrying layer for wiring. The sunken insulation layer may comprise widenings, for example, serving as a carrier for a number of conductive strips, or at an area where external supply conductors can be connected, for example, by soldering.

Referece is also made to my related concurrentlyfiled application, Ser. No. 160,651, in which various methods are described for making devices combining a sunken oxide with a highly doped adjoining layer for use as a guard ring or channel stopper.

What is claimed is:

1. A semiconductor monolithic integrated circuit comprising a monocrystalline semiconductor substrate of a first conductivity type, a second-conductivity-type epitaxial semiconductor layer of a given thickness on a surface of said substrate, at least one isolation zone laterally dividing the epitaxial layer into a plurality of islands, at least one PN junction isolating each of said islands from the substrate, and at least one circuit element within one of the islands, said isolation zone including a region of silicon oxide extending from the epitaxial layer surface down into said epitaxial layer but spaced from said substrate such that said silicon oxide extends through only a part of the thickness of said epitaxial layer, and a region of said first conductivity type more heavily doped than said epitaxial layer and extending from said silicon oxide layer into contact with said substrate to complete the isolation of the islands.

2. A semiconductor monolithic integrated circuit comprising a monocrystalline semiconductor sugstrate of a first conductivity type, a second-conductivity-type epitaxial semiconductor layer of a given thickness on a surface of said substrate, at least one isolation zone laterally dividing the epitaxial layer into a plurality of islands, at least one PN junction isolating each of said islands from the substrate, and at least one circuit element within one of the islands, said isolation zone including a region of silicon oxide extending from the epitqaxial layer surface down into said epitaxial layer but spaced from said substrate such that said silicon oxide extends through only a part of the thickness of said epitaxial layer, and means for producing a depletion region extending from said substrate into said epitaxial layer and into contact with said silicon oxide layer to complete the isolation of the islands.

* * * * *